United States Patent [19]
Jenq

[11] Patent Number: 5,181,187
[45] Date of Patent: Jan. 19, 1993

[54] LOW POWER VOLTAGE SENSING CIRCUIT

[75] Inventor: Ching S. Jenq, San Jose, Calif.

[73] Assignee: Silicon Storage Technology, Inc., Sunnyvale, Calif.

[21] Appl. No.: 677,297

[22] Filed: Mar. 29, 1991

[51] Int. Cl.⁵ ............................................. G11C 11/40
[52] U.S. Cl. ................................... 365/182; 307/530; 365/189.01; 365/226
[58] Field of Search .................... 365/182, 189.01, 226, 365/227; 307/530

[56] References Cited

U.S. PATENT DOCUMENTS

| | | | |
|---|---|---|---|
| 4,953,127 | 8/1990 | Nagahashi et al. | 365/226 |
| 5,051,958 | 9/1991 | Arakawa | 365/226 |
| 5,070,481 | 12/1991 | Haubner et al. | 365/226 |

*Primary Examiner*—Terrell W. Fears
*Attorney, Agent, or Firm*—Limbach & Limbach

[57] ABSTRACT

A voltage sensing circuit receives an input voltage signal and generates an output voltage signal. The circuit has a sensing node. A first P-type MOS transistor is connected having one of its ends to receive the input voltage signal with the other end connected to the sensing node to provide a sensing signal. A first voltage source is connected to the gate of the first P-type transistor. A voltage dropping circuit receives the input voltage signal and generates a first drop voltage signal lower than the input voltage signal. A second P-type MOS transistor has one end connected to receive the first drop voltage signal. The first voltage source is also connected to the gate of the second P-type MOS transistor. A third N-type MOS transistor has a gate connected to the other end of the second P-type MOS transistor. The third N-type MOS transistor has one of its ends connected to the sensing node. A second voltage source is connected to the other end of the third N-type MOS transistor. A driving circuit comprising of an inverter is connected to the sensing node for receiving the sensing signal and for producing the output voltage signal in response thereto.

20 Claims, 2 Drawing Sheets

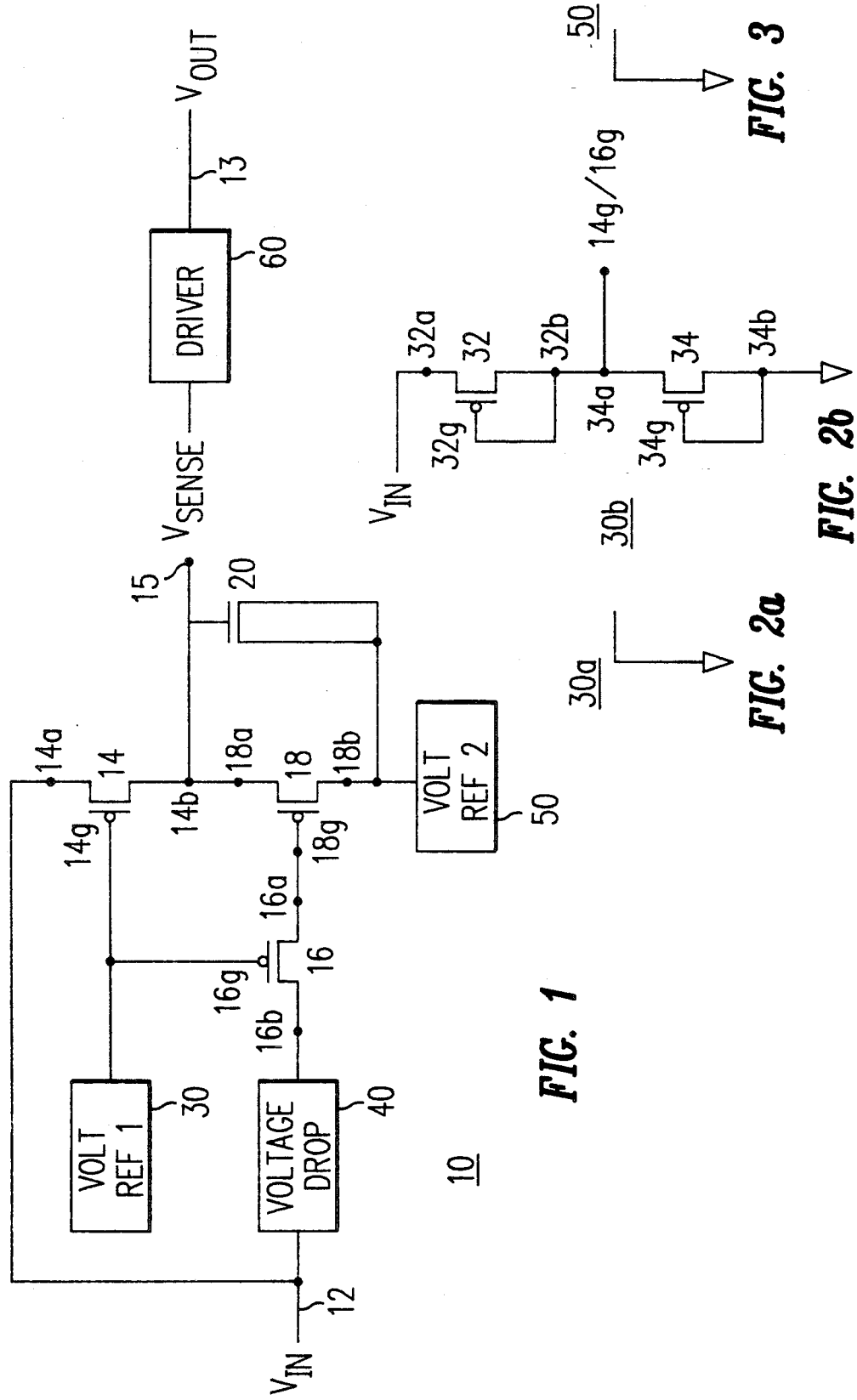

LOW POWER VOLTAGE SENSING CIRCUIT

TECHNICAL FIELD

The present invention relates to a voltage sensing circuit, and more particularly to a low power voltage sensing circuit for use with a single integrated circuit module having an electrically non-volatile memory array storing data and an electrically volatile memory array for receiving some of the data from the non-volatile memory array.

BACKGROUND OF THE INVENTION

Voltage sensing circuits are well known in the art. Typically, they are circuits used in an integrated circuit device. In one mode of operation termed "power up" mode, they receive the input voltage signal and generate an output voltage signal when the input voltage signal has exceeded a minimal threshold. Prior to that, when the input voltage signal is below the threshold level, the voltage sensing circuit does not generate the output voltage signal. The output voltage signal can be used to disable certain critical portion of the circuit to prevent it from causing uncertain status due to either voltage level or system noise. In many applications where the integrated circuit module comprises a memory array, this is crucial to protect the integrity of the data that is stored in the memory array.

A voltage sensing circuit also operates in a "power down" mode. In a power down mode, when the input voltage signal falls below a minimal threshold level, then the voltage sensing circuit would decrease its output voltage signal to zero, thereby assuring that when the power supply voltage goes below the minimal threshold level, certain critical portion of the circuit is disabled, preventing it from causing uncertainty in the state of the memory stored in the memory array due to low voltage level or system noise.

Although voltage sensing circuits are well known in the art, they have typically consumed too much power in their operation. As the level of integration increases and as integrated circuits find increasing usage in low power consumption applications, such as battery powered notebook computers, it is desirable to have the voltage sensing circuit consume less power.

SUMMARY OF THE INVENTION

Accordingly, in the present invention, a voltage sensing circuit is disclosed. The voltage sensing circuit receives an input voltage signal and generates an output voltage signal. The circuit has a sensing node. A first P-type MOS transistor has two ends and a gate. One end of the first transistor is connected to receive the input voltage signal. The other end of the first transistor is connected to the sensing node to provide a sensing signal thereto. The circuit also has means for receiving the input voltage signal and for generating a first voltage signal where the first voltage signal is lower in voltage than the input voltage signal. A second P-type MOS transistor also has two ends and a gate with one of its ends connected to receive the first voltage signal. A first voltage source is connected to the gates of the first and second P-type MOS transistors. A third N-type MOS transistor also has two ends and a gate, with one end connected to the sensing node. The gate of the N-type MOS transistor is connected to another end of the second P-type MOS transistor. A second voltage source is connected to another end of the third N-type MOS transistor. A driver means is connected to the sensing node for receiving the sensing signal and for producing the output voltage signal in response thereto.

BRIEF DESCRIPTION OF THE DRAWINGS

FIG. 1 is a schematic circuit diagram of the voltage sensing circuit of the present invention.

FIGS. 2a and 2b are two embodiments of the circuit shown in the block referred to as "Volt Ref 1", shown in FIG. 1.

FIG. 3 is a schematic diagram of an embodiment of the circuit shown in the block referred to as "Volt Ref 2", shown in FIG. 1.

DETAILED DESCRIPTION OF THE DRAWINGS

Figure 4A:
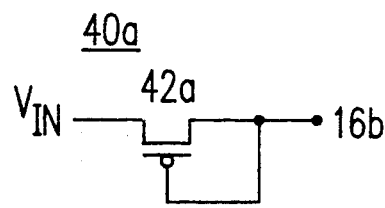
FIGS. 4a and 4b are two embodiments of the voltage drop circuit portion of the device shown in FIG. 1.

Referring to FIG. 1 there is shown a schematic block level diagram of the voltage sensing circuit 10 of the present invention. The voltage sensing circuit 10 receives an input voltage signal 12 and generates an output voltage signal 13. The circuit 10 comprises a sensing node 15 at which a sensing signal is generated. The sensing signal is supplied to a driver circuit 60 from which the output voltage signal 13 is produced.

The voltage sensing circuit 10 has a first transistor 14, shown in the preferred embodiment as being P-type MOS transistor. The transistor 14 has two ends, designated as 14a and 14b, and a gate, designated as 14g. In conventional MOS transistors, the two ends can be the source and drain. However, since the first transistor 14 and all the other transistors described herein are symmetrical in that the source and the drain can be interchanged, reference will only be made to each transistor as having two ends and a gate. One of the ends, 14a of first transistor 14 is connected to receive the input voltage signal 12. The other end, 14b is connected to the sensing node 15 to provide the sensing signal thereto. A first voltage reference 30, shown in greater detail hereinafter, supplies a first voltage to the gate 14g of the first transistor 14.

The input voltage signal 12 is also supplied to a voltage drop circuit 40, which will also be described in detail hereinafter. The voltage drop circuit 40 receives the input voltage signal 12 and generates a first voltage signal which is lower in voltage than the input voltage signal.

The voltage sensing circuit 10 also comprises a second P-type MOS transistor 16. The second transistor 16 also has two ends and a gate, designated as 16a, 16b and 16g respectively. One end 16b of the second transistor 16 is connected to the voltage drop circuit 40 and receives the first voltage signal therefrom. The gate 16g of the second transistor 16 is connected to the voltage reference 1 circuit 30 and receives the first voltage source therefrom.

Finally, the voltage sensing circuit 10 comprises a third N-type MOS transistor 18. The third transistor 18 has two ends and a gate: 18a, 18b and 18g, respectively. One end 18a of the third transistor 18 is connected to the sensing node 15. The gate 18g of the third transistor 18 is connected to the second end 16a of the second transistor 16. The other end 18b of the third transistor 18 is connected to a voltage reference 2 circuit 50. The voltage reference 2 circuit 50 shown in greater detail hereinafter, supplies a second voltage source to the second end 18b of the third transistor 18.

Although the voltage sensing circuit 10 shown in FIG. 1 also shows a N-type MOS transistor 20, whose gate is connected to the sensing node 15, and whose two ends are connected to the voltage reference 2 circuit 50, this transistor is not germane to the invention. Its function is to adding loading capacitance to node 15 to reduce voltage coupling from $V_{in}$ to node 15.

Referring to FIG. 2a, there is shown one embodiment of the voltage reference 1 circuit 30. In the one embodiment 30a, the voltage reference 1 is simply a connection to a ground source. The first voltage source which is supplied to the gates 14g and 16g is simply ground voltage.

Referring to FIG. 2b there is shown another embodiment of the reference voltage 1 circuit 30. In this embodiment, the voltage reference 1 circuit 30 comprises a fifth P-type MOS transistor 32 having one end 32a connected to receive the input voltage signal. The gate 32g of the fifth transistor 32 is connected to the other end 32b of the fifth transistor 32. A sixth transistor 34 is also a P-type MOS transistor. The gate 34g of the sixth type transistor 34 is connected to one end 34b of the sixth transistor 34 and is connected to a ground potential. The other end 34a of the sixth transistor 34 is connected to the other end 32b of the fifth transistor 32 and is supplied as the first voltage source to the gates 14g and 16g.

Referring to FIG. 3 there is shown one embodiment of the voltage reference 2 circuit 50. In the preferred embodiment, the second voltage source produced by the voltage reference to circuit 50 is simply the ground potential.

Referring to FIG. 4a, there is shown one embodiment of the voltage drop circuit 40. In the embodiment shown in FIG. 4a, the voltage drop circuit 40 comprises a seventh transistor 42a. The seventh transistor 42a is of a P-type MOS transistor whose gate is tied to one end thereof and is also supplied to node 16b of second transistor 16. The other end of the seventh transistor 42a is connected to receive the input voltage signal.

Figure 4B:
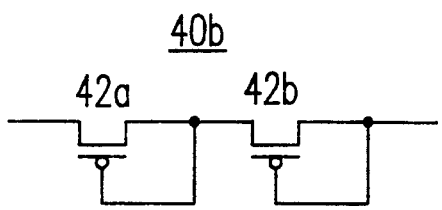

Referring to FIG. 4b there is shown another embodiment of the voltage drop circuit 40. In this embodiment, a plurality of P-type MOS transistors 42a and 42b are connected in series. One end of one of the transistors 42a is connected to another end of the other transistor 42b. Each of the gates of the transistors 42a and 42b are connected to one of the ends, respectively.

The operation of the voltage sensing circuit 10 will now be explained with reference to the voltage reference 1 circuit 30 being simply ground voltage and the voltage drop circuit 40 being simply the embodiment shown in FIG. 4a. In the power up mode when the input voltage signal 12 begins to increase, first transistor 14 is off until the input voltage signal 12 or $V_{in}$ exceeds the threshold of the first transistor 14. Thus, during the time period when $V_{in}$ is between zero and is below the threshold of first transistor 14, the sensing signal at node 15 would remain at ground potential. In addition, node 16b is always at a voltage drop caused by the voltage drop circuit 40, below that of $V_{in}$. In the embodiment where the voltage drop circuit 40 is shown by the circuit shown in FIG. 4a, the voltage at node 16b is $V_{in}$ minus the threshold of seventh transistor 42a. With node 15 at ground potential, second and third transistor 16 and 18, respectively, would also be off.

When the input voltage signal 12 exceeds the threshold of first transistor 14, first transistor 14 would turn on. This would cause node 15 or the sensing signal to charge up and reach up to the voltage of the input voltage signal 12 or $V_{in}$. With $V_{in}$ slightly above the threshold of first transistor 14, second and third transistor 16 and 18 respectively would still be turned off.

When $V_{in}$ exceeds the threshold of the seventh transistor 42a, node 16b would be at or above ground potential. This would turn on second transistor 16, causing a slight positive potential to be supplied to the gate 18g of the third transistor 18. This would turn on the third transistor 18. As will be discussed hereinafter, although both first and third transistors 14 and 18 will be turned on, the voltage at node 15 or the sensing signal would continued to be held substantially at $V_{in}$. This is because first transistor 14, in the preferred embodiment, is an FET transistor having a channel width greater than its length. In contrast, the third transistor 18 has a channel length greater than its width. Since the channel width of the first transistor 14 is greater than the channel width of the third transistor 18, the first transistor 14 is "stronger" in that more current passes through the first transistor 14. Thus, the voltage at node 15 would be maintained at substantially the voltage of the input voltage signal 12.

Further, by making third transistor 18 "weaker" than the first transistor 14, this reduces the DC current path through the first and third transistors 14 and 18 respectively, thereby conserving power consumption.

Once the sensing node 15 reaches the maximum input voltage signal 12, the driver circuit 60 generates the output voltage signal 13.

In the operation of the voltage sensing circuit 10 of the present invention during the "power down" mode, so long as $V_{in}$ is greater than the threshold of the first transistor 14, the voltage at node 15 remains high. However, as soon as $V_{in}$ drops below the threshold voltage of first transistor 14, first transistor 14 would be turned off. However, third transistor 18 would remain conducting. Thus, the voltage at node 15 would be pulled lower by the conducting action of the third transistor 18.

In addition, as $V_{in}$ continues to drop, below the threshold of the seventh transistor 42a, the voltage at node 16b would be isolated. This causes the voltage at node 18g to be isolated. Since the voltage at node 18g is a positive potential, it would continue to turn on third transistor 18, causing it to pull down further the voltage at node 15. Since node 16b and 18g are isolated, even if $V_{in}$ drops to zero, by the action of the seventh transistor 42a being cut off, the positive voltage as applied to the gate of the third transistor 18 speeds up the discharge of node 15 to ground potential when first transistor 14 is turned off. This reduces the hysteresis of the triggering voltage between the power up and power down sequences. In the event the PMOS second transistor 16 is built in an N-well process, the N-well is tied to $V_{in}$. Nodes 16b and 18g are then connected to $V_{in}$ though the diode formed between the source and drain of second transistor 16 and the N-well. In this case, node 18g will be at one diode threshold above $V_{in}$, thereby speeding up the discharge of node 15.

As can be seen from the foregoing, the threshold to trigger the "power up" or the "power down" is determined by the threshold of the first transistor 14. This threshold can be changed by appropriate changes in the bias to the gate of the first transistor 14. Thus, referring to FIG. 2b, there is shown another embodiment of the voltage reference 1 circuit 30. In this embodiment, a voltage is not be applied to gate 14g until $V_{in}$ has exceeded the threshold voltage of the fifth transistor 32. Thereafter, the voltage on gate 14g is approximately the threshold of the sixth transistor 34. To turn on the first transistor 14, $V_{in}$ must exceed approximately the sum of the threshold voltage of first transistor 14 and the voltage applied to gate 14g. Thus, with the embodiment shown in FIG. 2b, the "triggering" voltage to turn on first transistor 14 is approximately the sum of the threshold of the first transistor 14 and the threshold of the sixth transistor 34. By appropriately biasing the gate of the first transistor 14, the triggering voltage or the threshold voltage can be changed.

To further reduce the drive on third transistor 18, the fourth transistor 42a, which is acting as a single PMOS diode, can be replaced by two PMOS diodes in series as shown in FIG. 4b. Referring to FIG. 4b, there is shown two P-type MOS transistors 42a and 42b, each having its gate connected to one of the ends. The two transistors 42a and 42b are connected in series thereby giving a greater voltage drop across the two transistors.

Figure 5A:
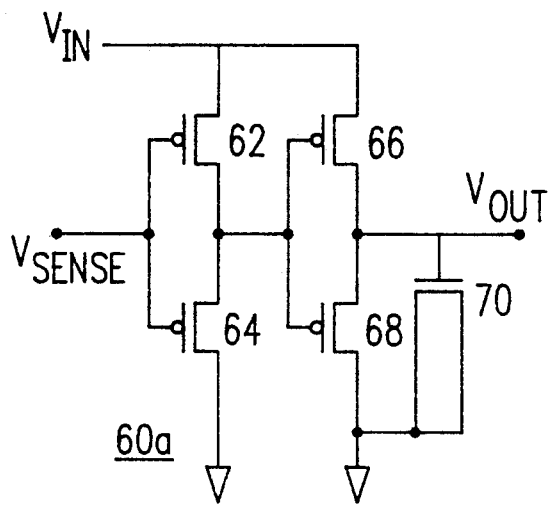
FIGS. 5a and 5b are two embodiments of the driver portion of the device shown in FIG. 1.
Figure 5B:
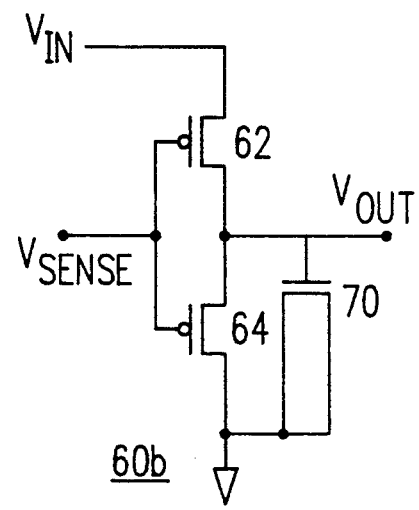

Referring to FIG. 5a and 5b, there is shown two different embodiments of the driver circuit 60. The driver circuit 60 can simply comprises an inverter, as shown in FIG. 5b or two inverters in series as shown in FIG. 5a. These inverters are well known in the art.

In the preferred embodiment, the transistors described heretofore have the following channel lengths (L) and channel widths (W):

| Transistor | | L | W |
| --- | --- | --- | --- |
| 1st | 14 | 3 | 30 |
| 2nd | 16 | 5 | 100 |
| 3rd | 18 | 140 | 2.4/3.8 |
| 4th | 20 | 5 | 5 |
| 5th | 32 | 80 | 3 |
| 6th | 34 | 3 | 100 |
| 7th | 42a | 1.4 | 20 |
| 8th | 42b | 1.4 | 20 |
| 9th | 62 | 1.6 | 5 |
| 10th | 64 | 10 | 2.4 |
| 11th | 66 | 1.4 | 5 |
| 12th | 68 | 1.2 | 2.4 |
| 13th | 70 | 10 | 10 |

Figure 6:
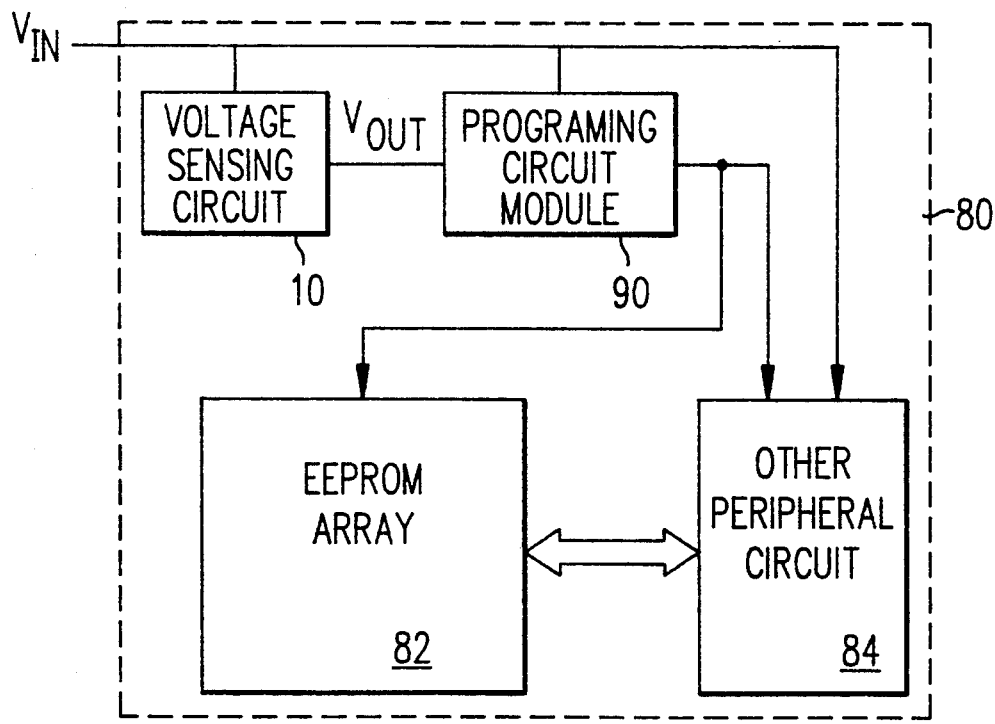
FIG. 6 is a schematic block diagram of a single integrated circuit module with an electrically non-volatile memory array and the voltage sensing circuit of the present invention.
Figure 4A:
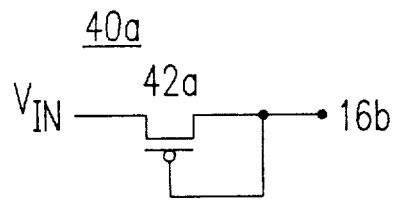
Figure 4B:
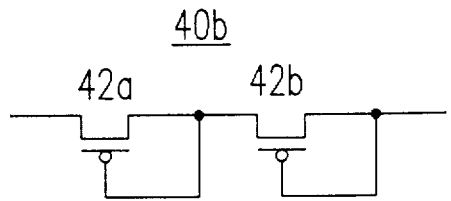
Figure 5A:
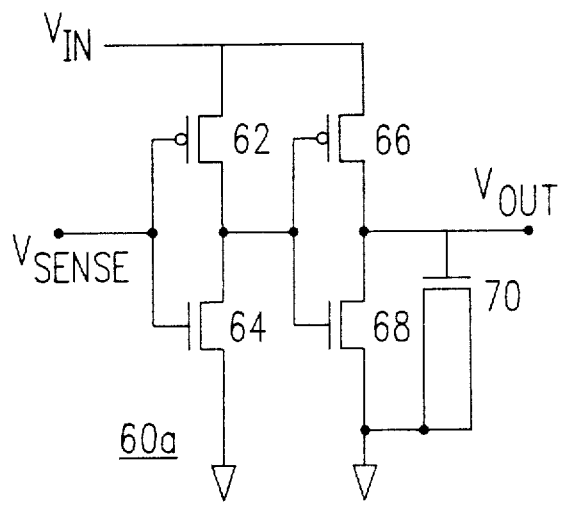
Figure 5B:
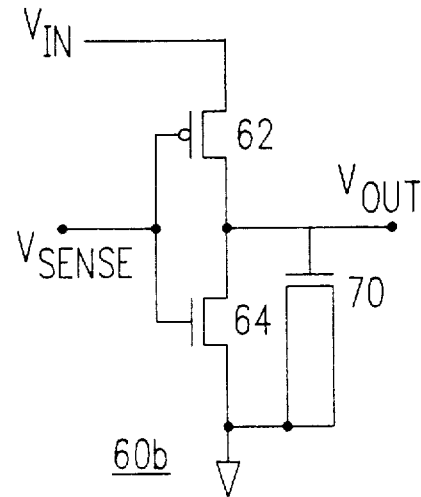
Figure 6:
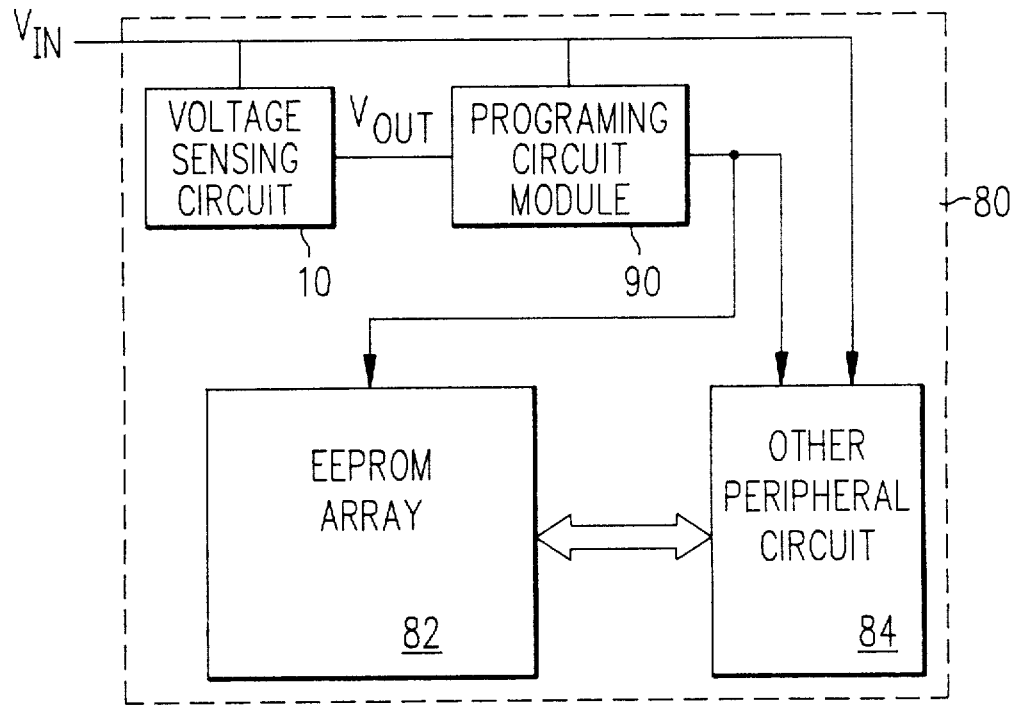

The voltage sensing circuit 10 of the present invention can be used in a single integrated circuit module 80 having an electrically erasable programmable memory array 82, communicating with other peripheral circuits 84. This is shown in FIG. 6. In such an application, the voltage sensing circuit 10 of the present invention, during power up, prevents the programming circuit module 90 from entering the programming mode until the voltage $V_{in}$ has reached at least a minimal threshold level. This insures that the EEPROM memory array 82 will not be accidentally programmed during the power up/power down periods when the system is extremely noisy.

There are many advantages to the voltage sensing circuit 10 of the present invention. First, the threshold voltage or the triggering voltage is made dependent upon a single transistor threshold, whose gate biasing voltage is also variable. In addition, the DC current in the operation of the voltage sensing circuit 10 of the present invention is through the path of the first transistor 14 and third transistor 18 and can be made extremely low by using a very weak third pull down transistor 18. For the embodiment shown in FIG. 2b, the DC path provided by the fifth and sixth transistors 32 and 34 respectively can also be made extremely resistive, thereby producing low current conduction by using a very weak pull down sixth transistor 34. Finally, the third transistor 18 can be biased at a voltage lower than $V_{in}$ during the power up and during the normal operation period to reduce current flow. The gate to the third transistor 18 can be biased at a voltage higher than $V_{in}$ during the power down sequence to speed up the triggering process and minimize the hysteresis of the triggering voltage.

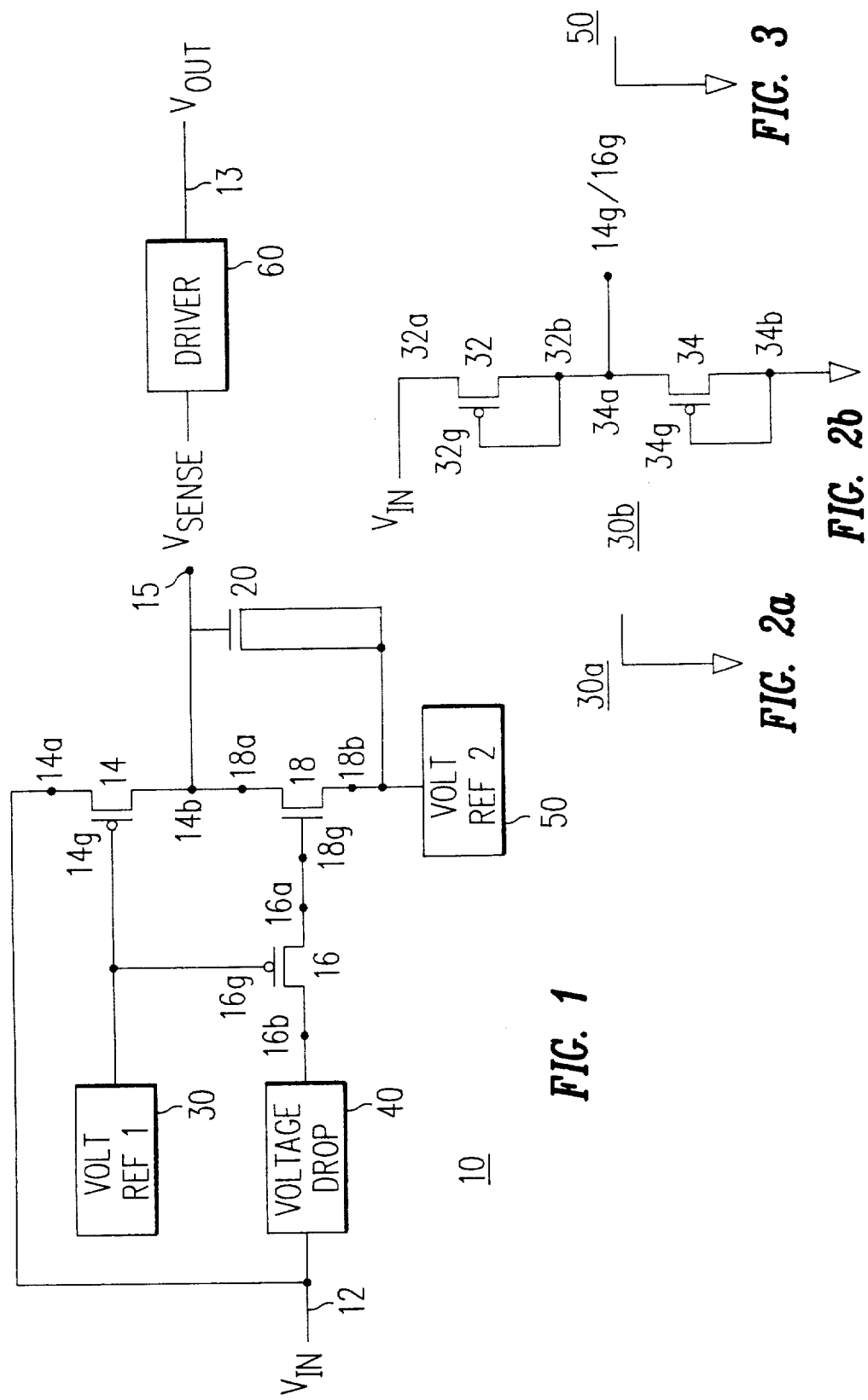

What is claimed is:

1. A voltage sensing circuit, for receiving an input voltage signal and for generating an output voltage signal, said circuit comprising:

a sensing node;

a first transistor means of one conduction type, having two ends and a gate; one end connected to receive said input voltage signal, another end connected to said sensing node to provide a sensing signal thereto;

means for receiving said input voltage signal and for generating a first voltage signal, said first voltage signal lower in voltage than said input voltage signal;

a second transistor means of one conduction type, having two ends and a gate; one end connected to receive said first voltage signal;

a first voltage source connected to said gate of said first and second transistor means;

a third transistor means of another conduction type, having two ends and a gate; one end connected to said sensing node, said gate connected to another end of said second transistor means;

a second voltage source connected to said another end of said third transistor means; and a driver means connected to said sensing node for receiving said sensing signal and for producing said output voltage signal in response thereto.

2. The circuit of claim 1 wherein said second voltage source is ground.

3. The circuit of claim 1 wherein said first voltage source is ground.

4. The circuit of claim 1 wherein said input and output voltage signals are positive voltage signals.

5. The circuit of claim 4 wherein said first and second transistor means of one conduction type is P type MOS transistor.

6. The circuit of claim 5 wherein said third transistor means of another conduction type is N type MOS transistor.

7. The circuit of claim 4 further comprising means for generating said first voltage source.

8. The circuit of claim 7 wherein said means for generating said first voltage source further comprising:

a fourth transistor means of one conduction type having two ends and a gate, one end for receiving said input voltage signal, said gate connected to said another end, said another end providing said first voltage source;

a fifth transistor means of one conduction type having two ends and a gate, one end connected to said another end of said fourth transistor means, said gate connected to said another end, said another end connected to receive said second voltage source.

9. The circuit of claim 8 wherein said fourth and fifth transistor means of one conduction type is P type MOS transistor.

10. The circuit of claim 1 wherein said means for generating said first voltage signal further comprising:
a fourth transistor means of one conduction type, having two ends and a gate; one end connected to receive said input voltage signal, said gate connected to another end, said another end for producing said first voltage signal.

11. The circuit of claim 1 wherein said means for generating said first voltage signal further comprising:
a fourth transistor means of one conduction type, having two ends and a gate; one end connected to receive said input voltage signal, said gate connected to another end;
a fifth transistor means of one conduction type, having two ends and a gate, one end connected to said another end of said fourth transistor means, said gate connected to another end, said another end for producing said first voltage signal.

12. The circuit of claim 1 wherein said driver means further comprising:
an inverting means for receiving said sensing signal and for producing said output voltage signal.

13. The circuit of claim 1 wherein said driver means further comprising:
a plurality of inverting means connected in series, the first of which receives said sensing signal, the last of which produces said output voltage signal.

14. In a single integrated circuit module having an electrically non-volatile memory array storing data, and a programming control logic circuit for controlling the programming of said memory array, wherein the improvement comprising:
a voltage sensing circuit, for receiving an input voltage signal and for generating an output voltage signal supplied to said programming control logic circuit for enabling or disabling the programming of said memory array, said circuit comprising:
a sensing node;
a first transistor means of one conduction type, having two ends and a gate; one end connected to receive said input voltage signal, another end connected to said sensing node to provide a sensing signal thereto;
means for receiving said input voltage signal and for generating a first voltage signal, said first voltage signal lower in voltage than said input voltage signal;
a second transistor means of one conduction type, having two ends and a gate; one end connected to receive said first voltage signal;
a first voltage source connected to said gate of said first and second transistor means;
a third transistor means of another conduction type, having two ends and a gate; one end connected to said sensing node, said gate connected to another end of said second transistor means;
a second voltage source connected to said another end of said third transistor means; and
a driver means connected to said sensing node for receiving said sensing signal and for producing said output voltage signal in response thereto.

15. The circuit of claim 14 wherein said input and output voltage signals are positive voltage signals.

16. The circuit of claim 15 wherein said first and second transistor means of one conduction type is P type MOS transistor.

17. The circuit of claim 16 wherein said third transistor means of another conduction type is N type MOS transistor.

18. The circuit of claim 15 further comprising means for generating said first voltage source.

19. The circuit of claim 18 wherein said means for generating said first voltage source further comprising:
a fourth transistor means of one conduction type having two ends and a gate, one end for receiving said input voltage signal, said gate connected to said another end, said another end providing said first voltage source;
a fifth transistor means of one conduction type having two ends and a gate, one end connected to said another end of said fourth transistor means, said gate connected to said another end, said another end connected to receive said second voltage source.

20. The circuit of claim 14 wherein said means for generating said first voltage signal further comprising:
a fourth transistor means of one conduction type, having two ends and a gate; one end connected to receive said input voltage signal, said gate connected to another end, said another end for producing said first voltage signal.

* * * * *

UNITED STATES PATENT AND TRADEMARK OFFICE
CERTIFICATE OF CORRECTION

PATENT NO. : 5,181,187
DATED : January 19, 1993
INVENTOR(S) : Ching S. Jenq

It is certified that error appears in the above - identified patent and that said Letters Patent is hereby corrected as shown below:

In the Drawings:

Please substitute the drawings, consisting of Figure 1, Figures 2a, 2b, Figure 3, Figures 4a, 4b, Figures 5a, 5b and Figure 6, for the two sheets of drawing attached.

Specifically the changes relate to:

Figure 1, the bubble has been removed from gate 18g.

Figure 5a, the bubble has been removed from transistor 64 and transistor 68.

Figure 5b, the bubble has been removed from transistor 64.

Signed and Sealed this

Fourth Day of January, 1994

Attest:

BRUCE LEHMAN

Attesting Officer

Commissioner of Patents and Trademarks